United States Patent
Seymour et al.

(10) Patent No.: US 6,529,080 B1
(45) Date of Patent: Mar. 4, 2003

(54) TOI AND POWER COMPRESSION BIAS NETWORK

(75) Inventors: David J. Seymour, Plano, TX (US); Randy L. Cochran, Sachse, TX (US); Timothy M. Gittemeier, Plano, TX (US)

(73) Assignee: Sirenza Microdevices, Inc., Sunnyvale, CA (US)

( * ) Notice: Subject to any disclaimer, the term of this patent is extended or adjusted under 35 U.S.C. 154(b) by 0 days.

(21) Appl. No.: 09/951,686

(22) Filed: Sep. 11, 2001

(51) Int. Cl.[7] ................................................. H03F 3/04
(52) U.S. Cl. ....................................... 330/296; 330/288
(58) Field of Search ................................. 330/149, 288, 330/296

(56) References Cited

U.S. PATENT DOCUMENTS 5,517,688 A * 5/1996 Fajen et al. .................. 455/333
5,590,411 A * 12/1996 Sroka et al. .................. 455/78
5,678,226 A * 10/1997 Li et al. ....................... 455/333
5,710,523 A * 1/1998 Kobayashi ................... 330/293
6,275,687 B1 * 8/2001 Lloyd .......................... 455/292

OTHER PUBLICATIONS

"An HBT MMIC Power Amplifier with an Integrated Diode Linearizer for Low–Voltage Portable Phone Applications", By: Toshihiko Yoshimasu et al., IEEE Journal of Solid–State Circuits, vol. 33, No. 9, Sep. 1998, pp. 1290–1296.

* cited by examiner

Primary Examiner—Robert Pascal
Assistant Examiner—Henry Choe
(74) Attorney, Agent, or Firm—Christopher P. Maiorana, P.C.

(57) ABSTRACT

An apparatus comprising an amplifier and a circuit. The amplifier may be configured to amplify an input signal. The circuit may be configured to (i) control the amplifier, (ii) compensate for non-linear characteristics of the amplifier, (iii) increase third-order intercept (TOI) and (iv) increase the output 1 dB compression point (P1 dB).

19 Claims, 5 Drawing Sheets

US 6,529,080 B1

TOI AND POWER COMPRESSION BIAS NETWORK

FIELD OF THE INVENTION

The present invention relates to a method and/or architecture for implementing active bias networks generally and, more particularly, an active bias network configured to increase Third-Order Intercept, the 1 dB (decibel) compression point, and improve noise performance of an integrated circuit (IC) amplifier. The present invention may also provide a simplified method of packaging.

BACKGROUND OF THE INVENTION

Referring to FIG. 1, a typical amplifier 10 that may be used for biasing is shown. The amplifier 10 implements a resistor string RA and RB for biasing. The resistor string RA and RB provides a correct base (or gate voltage) for a desired device current. However, the resistor string (or divider) RA and RB does not provide temperature or process variation correction.

Referring to FIG. 2, a typical biased amplifier circuit is shown. The amplifier 20 includes a bias network of a number of resistors R1, R2, R3, R4, and R5, a transistor Q1, a transistor Q2 and a capacitor C1. The amplifier 20 includes the bias network to provide temperature and process variation correction. However, the bias network does not correct for the non-linearity of the network.

SUMMARY OF THE INVENTION

The present invention concerns an apparatus comprising an amplifier and a circuit. The amplifier may be configured to amplify an input signal. The circuit may be configured to (i) control the amplifier, (ii) compensate for non-linear characteristics of the amplifier and (iii) increase the third-order intercept (TOI).

The objects, features and advantages of the present invention include providing a method and/or architecture for active bias networks that may (i) improve the third-order intercept (TOI) (ii) improve noise performance of an integrated circuit amplifier, (iii) improve the 1 dB compression point without the use of external components, (iv) implement a three terminal integrated circuit and/or (v) be implemented in a low cost package.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 3:
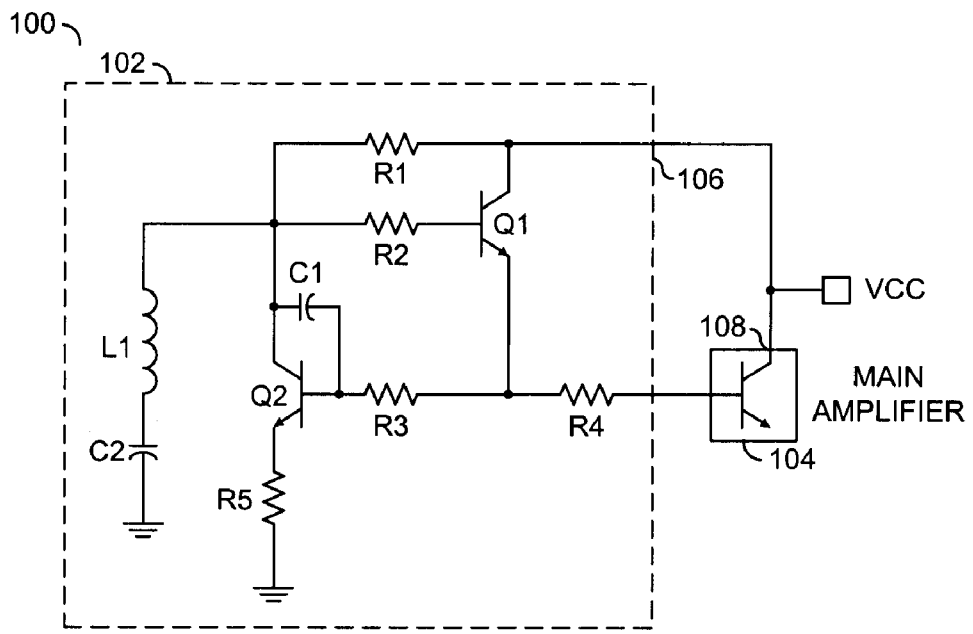
FIG. 3 is a schematic of a preferred embodiment of the present invention.

Referring to FIG. 3, a block diagram of a circuit (or system) 100 is shown in accordance with a preferred embodiment of the present invention. The circuit 100 may be implemented as an active bias network and integrated circuit (IC) amplifier. The circuit 100 generally comprises a block (or circuit) 102 and a block (or circuit) 104. In one example, the circuit 102 may be implemented as an active bias network and the circuit 104 may be implemented as an IC amplifier. The active bias network 102 may be configured to control the amplifier 104. The amplifier 104 may be configured to generate an amplified signal (not shown).

The active bias network 102 may be designed to increase the third-order intercept (TOI), the 1 dB compression point and/or improve the noise performance of the IC amplifier 104. TOI may be the extrapolated power level, where the fundamental output power intercepts the extrapolated third-order intermodulation product output power level. The third-order intercept (TOI) point may be a measure of a power level where significant undesired non-linear distortion of a communication signal occurs. For example, the TOI may be related to a maximum signal that may be processed without causing significant problems to the accurate reproduction of desired information (e.g., a wireless telephone signal, or a TV signal).

The active bias network 102 may allow for low cost three terminal packages to be implemented. The circuit 100 may allow the active bias network 102 to provide improved RF performance. The circuit 100 may also allow the network 102 to implement tuning to compensation for non-linear characteristics of the active bias network 102 and further increase the TOI.

The circuit 102 may have an input 106 that may receive a power supply (e.g., VCC). The circuit 104 may have an input 108 that may receive the power supply VCC. The circuit 102 generally comprises a number of resistors (e.g., R1, R2, R3, R4 and R5), a capacitor (e.g., C1), a capacitor (e.g., C2), a device (e.g., Q1), a device (e.g., Q2), and an inductor (e.g., L1). A resistance of the resistors R1–R5 may be varied in order to meet the criteria of a particular implementation. A capacitance of the capacitors C1 and C2 may be varied in order to meet the criteria of a particular implementation. The devices Q1 and Q2 may be implemented as CMOS, NPN, PNP, MESFET, PHEMT, or MOSFET type devices. However, the particular type of the devices Q1 and Q2 may be varied in order to meet the criteria of a particular implementation. The inductance of inductor L1 may also be varied in order to meet the criteria of a particular implementation.

The inductor L1 and the capacitor C2 may be configured to compensate for the non-linearity of the active bias network 102. The active bias network 102 may be a non-linear device and may generate harmonics similar to the non-linearity of the main amplifier 104. If the amplitude and the phase of the harmonics of the active bias network 102 are adjusted in proper relationship to the harmonics of the amplifier 104, then cancellation of a portion of the non-linearity may occur. The inductor L1 and the capacitor C2 may also be configured to shunt current of the circuit 100 to modify the amplitude and phase of the harmonics of the active bias network 102, such that the harmonics are partially canceled. Additionally, the inductor L1 and the capacitor C2 may be tuned to maximize the TOI and center performance in a particular frequency band of interest.

Figure 4:
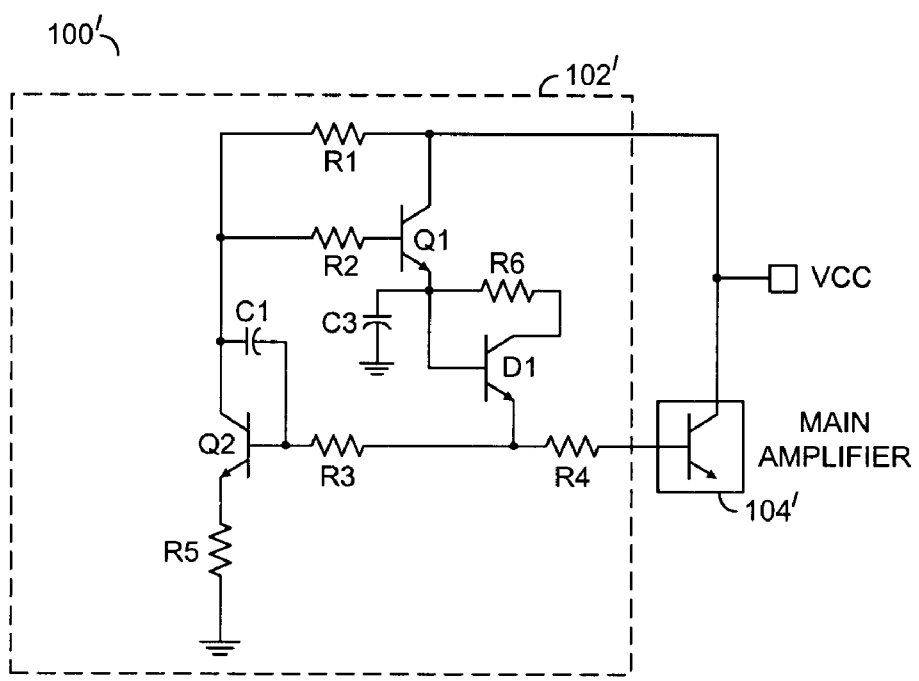
FIG. 4 is a schematic of another embodiment of the present invention.

Referring to FIG. 4, a circuit 100' illustrating another embodiment of the present invention is shown. The circuit 100' may be similar to the circuit 100. The circuit 100' may implement an additional diode (e.g., D1) and a capacitor (e.g., C3) to provide increased point dB. The diode D1 and the capacitor C3 may be implemented to increase the TOI of the main amplifier 104, to increase the 1 dB compression point, and eliminate the need for additional external tuning components (e.g., the inductor L1 and the capacitor C2). The diode D1 may improve the phase and amplitude response of the amplifier 104. However, the circuit 100' may require an additional resistor string (e.g., R6) to bias the amplifier 104. The resistor network 100 of FIG. 3 does not generally provide temperature or process compensation. Therefore, the compensation diode D1 and the compensation capacitor C3 may be implemented within the active bias circuit 102' to (i) provide both temperature and process compensation, (ii) increase the 1 dB compression point, and/or (iii) increase TOI.

Figure 5:
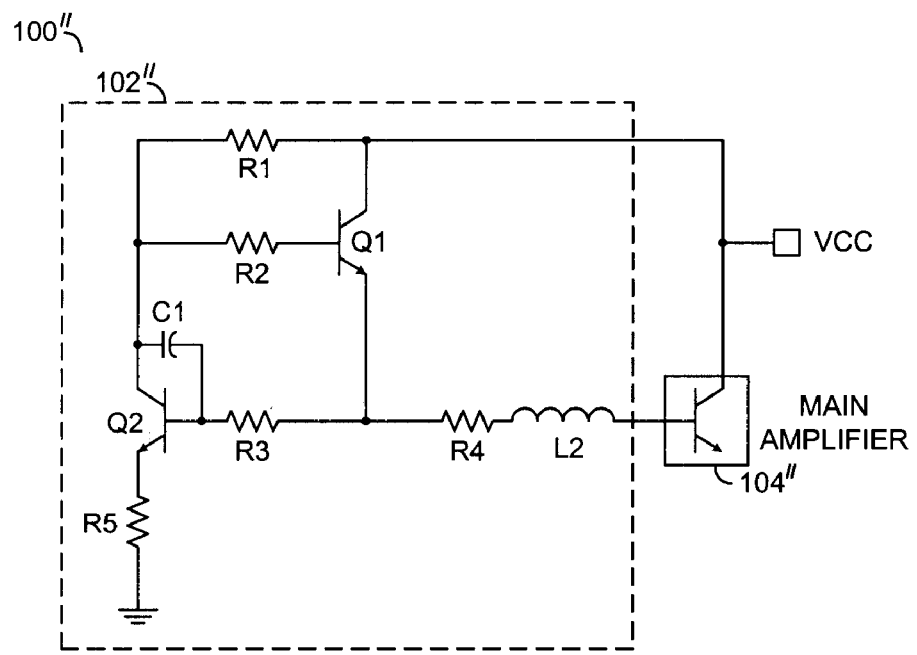
FIG. 5 is a schematic of another embodiment of the present invention.

Referring to FIG. 5, a circuit 100'' illustrating another embodiment of the present invention is shown. The circuit 100'' may be similar to the circuits 100 and 100'. The circuit 100'' may additionally implement an inductor (e.g., L2) to reduce noise created by the circuit 102'' and/or the output signal from the amplifier 104'' that is being fed back to the circuit 102''. The active bias network 102 of FIG. 3 may add additional noise to the main amplifier 104. Therefore, the active bias network 102'' may implement the inductor L2 to increase the isolation of the active bias network 102'' from the main amplifier 104'' at RF frequencies and decrease the noise contribution from the active bias network 102''. However, the inductor L2 may reduce the effectiveness of the linearity improvement of the active bias network 102''. The circuit 100'' may have a tradeoff between improved noise performance and improved linearity performance.

Figure 6:
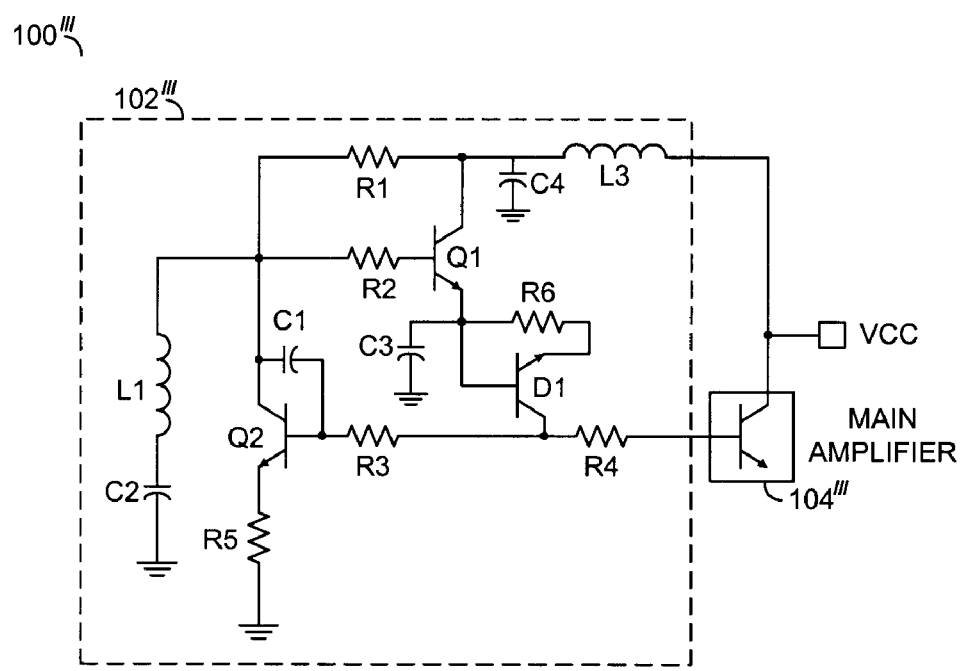
FIG. 6 is a schematic of another embodiment of the present invention.

Referring to FIG. 6, a circuit 100''' illustrating another embodiment of the present invention is shown. The circuit 100''' may be similar to the circuits 100, 100' and 100''. The circuit 100'' may implement an additional inductor (e.g., L3) and a capacitor (e.g., C4) to further reduce noise. The circuit 100''' may be implemented in a single three terminal package which may eliminate the need for expensive and/or larger RF and non-RF compatible multi-pin packages. Therefore, the IC amplifier 104''' may be smaller and more user friendly, while reducing the amount of required external components. The improvements illustrated in the circuit 100''' of FIG. 6 (e.g., the inductor L3 and the capacitor C4) may be implemented with any of the embodiments (e.g., the circuits 100, 100' or 100'') of the present invention.

Figure 1:
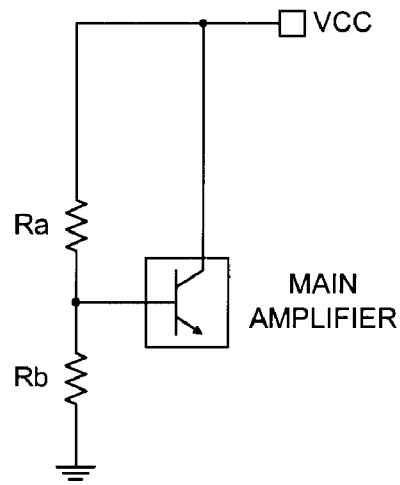
FIG. 1 is a schematic of a conventional amplifier biasing circuit.
Figure 2:
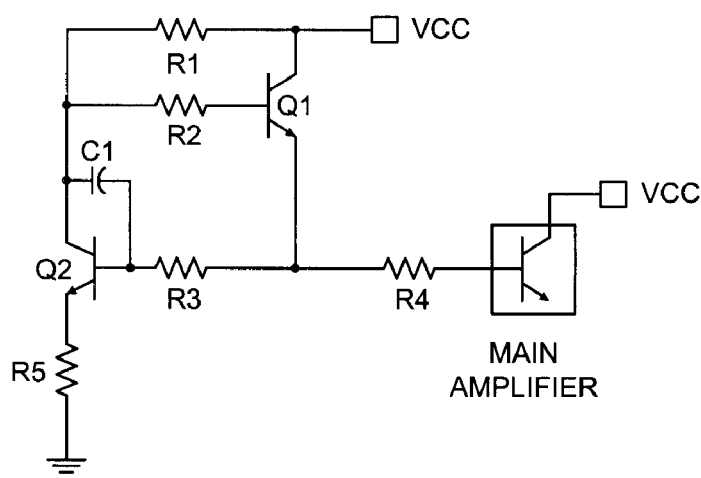
FIG. 2 is a schematic of a conventional amplifier biasing circuit with temperature and process variation correction.
Figure 7:
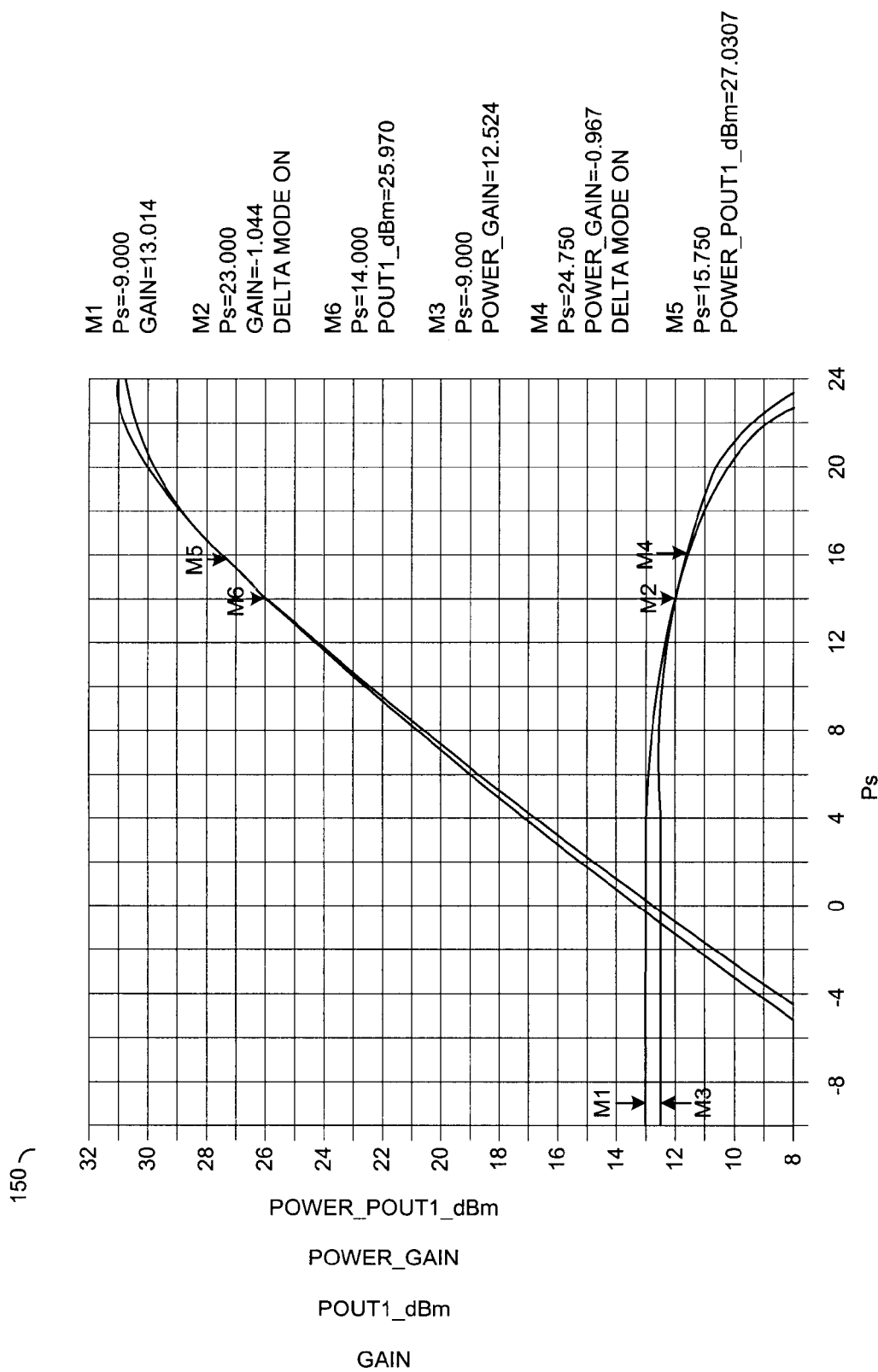
FIG. 7 is a graph of a harmonic balance simulation illustrating an operation of the present invention.

Referring to FIG. 7, a graph 150 illustrating a harmonic balance simulation of the circuit 20 of FIG. 2 and the circuit 100' of FIG. 4 is shown. The markers M3 and M4 illustrate the gain and 1 dB compression point for the circuit 100'. The marker M5 may be the output power of the amplifier 104' at the 1 dB compression point. The markers M1 and M2 may be the gain and 1 dB compression point for the circuit 20. The marker M6 may be the output power at the 1 dB compression point for the circuit 20.

Figure 8:
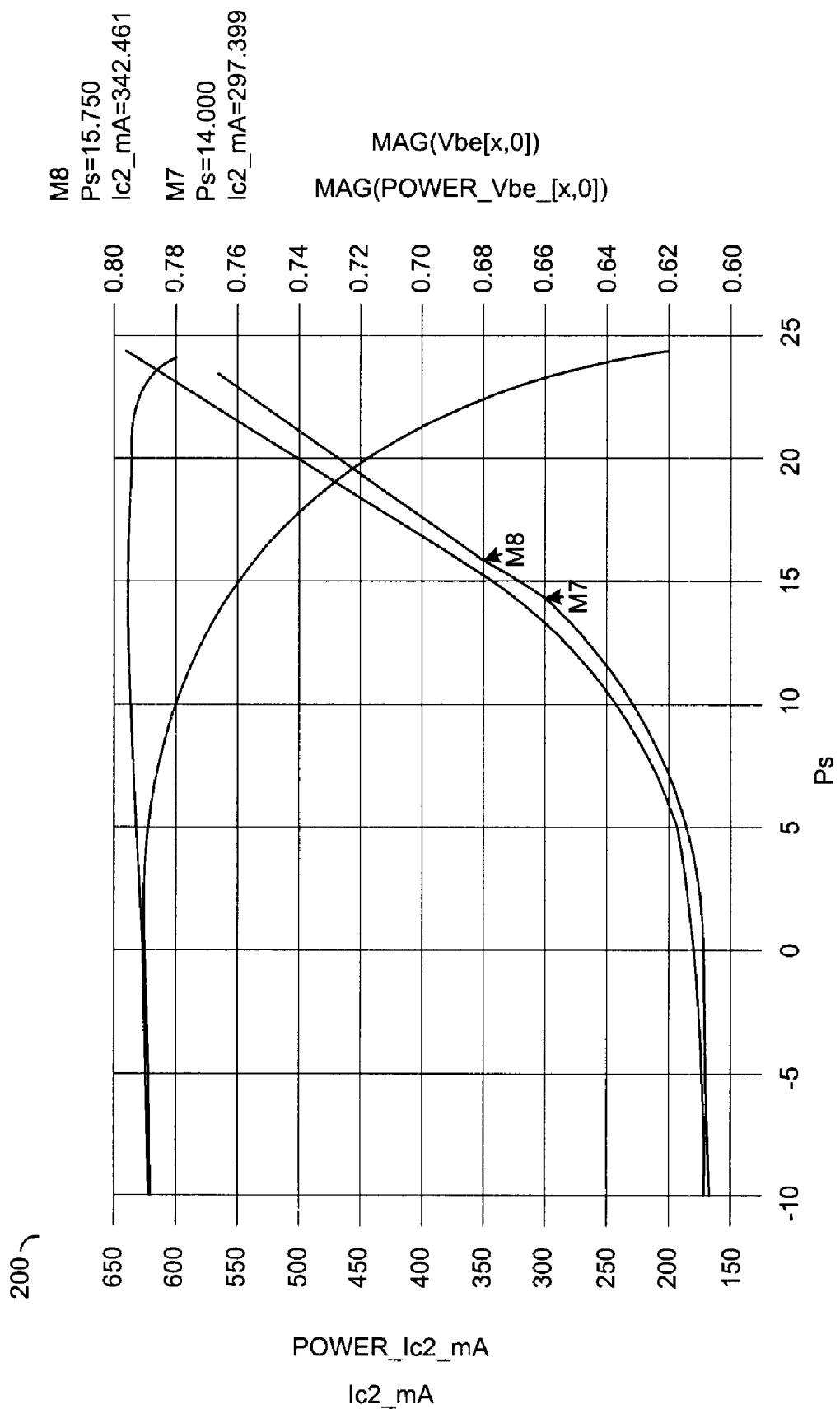
FIG. 8 is a graph of a DC simulation illustrating an operation of the present invention.

Referring to FIG. 8, a graph 200 illustrating a DC simulation of the circuit 20 of FIG. 2 and the circuit 100' of FIG. 4 is shown. The graph 200 may illustrate a collector current (e.g., Ic) and a base-emitter voltage (e.g., Vbe) of the main amplifier 104'. The marker M7 may be the current through the main amplifier of the circuit 20 at the 1 dB compression point. The marker M8 may be the current through the amplifier 104' of the circuit 100' at the 1 dB compression point. The graph 200 may also illustrate that the Vbe of the circuit 100' may remain fairly constant between the input power range of −10 dBm to +24 dBm. The graph 200 may illustrate that the Vbe of the circuit 20 is constant only over the input power range of −10 dBm to +5 dBm. Over the same −10 dBm to +24 dBm input power range Vbe, the circuit 20 may change more than 20%. The power added efficiency (PAE) of the circuit 20 may be 42.1% at the 1 dB compression point defined by the marker M6 of the graph 150 of FIG. 7. The PAE of the circuit 100' of FIG. 4 may be 49.4% at the 1 dB compression point defined by the marker M5 of the graph 200 of FIG. 7.

The circuit 100' of FIG. 4 may have a higher 1 dB compression point, (e.g., a 1.3 dB improvement over the circuit 20). The circuit 100' may have a higher PAE (e.g., a 7.3% increase over the circuit 20). The circuit 100' may also maintain a constant Vbe over a larger input power range. However, the circuit 100' may have approximately 0.5 dB less gain. The simulations 150 and 200 may illustrate that the diode D1, the capacitor C3 and the resistor string R6 may improve the dB compression point by 1–1.5 dB.

The circuit 100 may implement the inductor L1 and the capacitor C2 to improve TOI. The circuit 100 may implement the diode D1 and the capacitor C3 to improve the 1 dB compression point without the use of external components. The circuit 100 may implement the inductor L2 to improve noise performance of the amplifier 104. The circuit 100 may implement the inductor L3 and the capacitor C4 to allow a three terminal integrated circuit to be provided in a low cost package.

The circuit 100 may implement the active bias network 102 to provide tuning to compensate for non-linear characteristics of the active bias network 102 and increase the third-order intercept point. The circuit 100 may also increase the point P1 dB of the main IC amplifier 104 and eliminate any additional external tuning components. Additionally, the circuit 100 may be implemented within a single low cost package.

The circuit 100 may be implemented within the wireless market to meet various high performance requirements for RF components. Specifically, the circuit 100 may provide an amplifier with high performance in the area of higher linearity, higher output power compression, and lower noise. The circuit 100 may also allow simultaneous use of an active bias network to provide temperature and process compensation, improve linearity, output power compression and noise performance. Additionally, the circuit 100 may be used in low noise amplifier and power amplifier applications.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   an amplifier configured to amplify an input signal; and
   a control circuit (a) comprising one or more transistors connected between a collector and a base of said amplifier and (b) configured to (i) control said amplifier, (ii) compensate for non-linear characteristics of said amplifier, (iii) increase third-order intercept (TOI), and (iv) provide temperature and process variation correction to said amplifier.

2. The apparatus according to claim 1, wherein said control circuit comprises an active bias network.

3. The apparatus according to claim 1, wherein said apparatus comprises a TOI and power compensation bias network with an integrated circuit amplifier.

4. The apparatus according to claim 1, wherein said control circuit comprises:

one or more resistors;

one or more capacitors; and one or more inductors, wherein said resistors, said transistors, said capacitors and said inductors are coupled between a power source and said amplifier.

5. The apparatus according to claim 1, wherein said control circuit is further configured to eliminate external tuning components.

6. The apparatus according to claim 1, wherein said control circuit is further configured to reduce noise.

7. The apparatus according to claim 1, wherein said control circuit is further configured to allow for single package integration.

8. The apparatus according to claim 1, wherein said apparatus comprises a low noise amplifier.

9. The apparatus according to claim 1, wherein said apparatus comprises a high power amplifier.

10. An apparatus comprising:

means for amplifying a signal; and means for controlling said amplifying means, wherein said controlling means (i) comprises one or more transistors connected between a collector and a base of said amplifying means and (ii) compensates for non-linear characteristics, provides temperature and process variation correction, and increases third-order intercept (TOI).

11. A method for increasing third-order intercept (TOI) and power compensation in an amplifier comprising the steps of:

(A) amplifying an input signal; and (B) controlling step (A) with one or more transistors connected between a collector and a base of said amplifier by (i) compensating for non-linear characteristics, (ii) increasing third-order intercept (TOI), and (iii) providing temperature and process variation correction.

12. The method according to claim 11, wherein step (B) further comprises:

actively biasing said amplifier.

13. The method according to claim 11, wherein step (B) further comprises:

eliminating external tuning components.

14. The method according to claim 11, wherein step (B) further comprises:

reducing noise of said amplifier.

15. The method according to claim 11, wherein step (B) further comprises:

implementing said amplifier in a single package integration.

16. The method according to claim 11, wherein step (B) further comprises:

providing high performance high linearity amplification.

17. The method according to claim 11, wherein step (B) further comprises:

providing high performance low noise amplification.

18. The method according to claim 11, wherein step (B) further comprises:

providing high performance power amplification.

19. The method according to claim 11, wherein step (B) further comprises:

providing improved linearity.

* * * * *